United States Patent
Kim et al.

(10) Patent No.: US 9,636,746 B2
(45) Date of Patent: May 2, 2017

(54) METHOD FOR MANUFACTURING SILVER NANOWIRES

(75) Inventors: Sang-Ho Kim, Daejeon (KR); Suk-Sik Moon, Gongju-si (KR); Chang-Wan Bae, Incheon (KR); Dong Min Seo, Pyeongtaek-si (KR)

(73) Assignee: Nanotech & Beyond Co., Ltd., Kongju, Chungcheongnam-do (KR)

( * ) Notice: Subject to any disclaimer, the term of this patent is extended or adjusted under 35 U.S.C. 154(b) by 1052 days.

(21) Appl. No.: 13/811,342

(22) PCT Filed: Jul. 22, 2011

(86) PCT No.: PCT/KR2011/005426
§ 371 (c)(1),
(2), (4) Date: Apr. 1, 2013

(87) PCT Pub. No.: WO2012/011774
PCT Pub. Date: Jan. 26, 2012

(65) Prior Publication Data
US 2013/0272919 A1    Oct. 17, 2013

(30) Foreign Application Priority Data

Jul. 22, 2010 (KR) .................. 10-2010-0070886
Jul. 22, 2010 (KR) .................. 10-2010-0070889
(Continued)

(51) Int. Cl.
*B22F 9/24* (2006.01)
*B82Y 30/00* (2011.01)
(Continued)

(52) U.S. Cl.
CPC ............. *B22F 9/24* (2013.01); *B82Y 30/00* (2013.01); *B82Y 40/00* (2013.01); *C30B 7/00* (2013.01);
(Continued)

(58) Field of Classification Search
CPC ....................................................... B82Y 40/00
See application file for complete search history.

(56) References Cited

U.S. PATENT DOCUMENTS

| 2007/0034052 | A1  | 2/2007 | Vanheusden et al. |
| 2009/0196788 | A1* | 8/2009 | Wang ........................ B22F 9/24 |
|              |     |        | 420/501 |

(Continued)

FOREIGN PATENT DOCUMENTS

| CN | 1709791 A    | 12/2005 |
| JP | 2009155674 A | 7/2009  |

(Continued)

OTHER PUBLICATIONS

Machine translation of KR10-2010-0055983. May 2010.*
(Continued)

*Primary Examiner* — Jie Yang
*Assistant Examiner* — Xiaowei Su
(74) *Attorney, Agent, or Firm* — The Webb Law Firm (57) ABSTRACT

Provided is a method for producing Ag nanowires, including, heating a precursor solution that includes: an Ag salt; a water-soluble polymer; a surfactant, or a halide of metal ions having a standard reduction potential of −0.1 to −0.9V as a metal catalyst; and a reduction solvent, to produce the Ag nanowires. According to this method, a time for synthesizing nanowires may be considerably decreased, and an amount of Ag precursor discarded without reaction may be effectively reduced. As a result, the Ag nanowires may be produced with high efficiency and mass-production thereof through a simple scale-up may be successfully achieved.

12 Claims, 8 Drawing Sheets

(30) Foreign Application Priority Data

Jul. 22, 2011 (KR) .................. 10-2011-0072756
Jul. 22, 2011 (KR) .................. 10-2011-0072762

(51) Int. Cl.
| | | |
|---|---|---|
| B82Y 40/00 | (2011.01) | |
| C30B 7/00 | (2006.01) | |
| C30B 7/14 | (2006.01) | |
| C30B 29/02 | (2006.01) | |
| C30B 29/62 | (2006.01) | |
| B22F 1/00 | (2006.01) | |

(52) U.S. Cl.
CPC .......... *C30B 7/14* (2013.01); *C30B 29/02* (2013.01); *C30B 29/62* (2013.01); *B22F 1/0025* (2013.01); *B22F 2999/00* (2013.01)

(56) References Cited

U.S. PATENT DOCUMENTS

| | | | | |
|---|---|---|---|---|
| 2009/0321113 A1* | 12/2009 | Allemand | ............. | B22F 1/0022 174/257 |
| 2010/0148132 A1* | 6/2010 | Jiang | ............. | B82Y 30/00 252/514 |
| 2010/0242679 A1* | 9/2010 | Yu | ............. | B22F 1/0025 75/345 |
| 2011/0219913 A1 | 9/2011 | Suh et al. | | |

FOREIGN PATENT DOCUMENTS

| | | |
|---|---|---|
| JP | 2009203484 A | 9/2009 |
| KR | 1020100055983 A | 5/2010 |

OTHER PUBLICATIONS

Keum Hwan Park Thesis, 2008.*

Yugang Sun, et al.,"Uniform Silver Nanowires Synthesis by Reducing AgNO3 with Ethylene Glycol in the Presence of Seeds and Poly(Vinyl Pyrrolidone)", Chem. Mater. 2002, 14, 4736-4745.

Jinting Jiu, et al. "Synthesis of Silver Nanorods and Application for Die Attach Material in Devices", J Mater Sci: Mater Electron 2010, 21:713-718.

Gou et al., Convenient, Rapid Synthesis of Ag Nanowires, Chem. Mater., 2007, 1755-1760, vol. 19.

Sun and Xia, Large-Scale Synthesis of Uniform Silver Nanowires Through a Soft, Self-Seeding, Polyol Process, Advanced Materials, Jun. 5, 2002, 833-837, vol. 14, No. 11.

* cited by examiner

METHOD FOR MANUFACTURING SILVER NANOWIRES

CROSS-REFERENCE TO RELATED APPLICATIONS

This application claims priority under 35 U.S.C. §119 to Korean Patent Application No. 10-2010-0070889, filed on Jul. 22, 2010, No. 10-2010-0070886 filed on Jul. 22, 2010, No. 10-2011-0072762 filed on Jul. 22, 2011 and No. 10-2011-0072756 filed on Jul. 22, 2011 in the Korean Intellectual Property Office, the disclosures of which are incorporated herein by reference in their entirety.

TECHNICAL FIELD

The following disclosure relates to a method for producing silver nanowire and, more particularly, to a mass-producing method of silver nanowires in a short time using a liquid chemical process, a mass-producing method of high quality silver nanowires having a length of 10 μm or more and a uniform size, and a method for producing silver nanowires with high efficiency, comprising formation of silver nanowires from substantially the entire silver precursor introduced thereto.

BACKGROUND

A noble metal single crystalline nanowire has high chemical stability, thermal conductivity and electrical conductivity, thus embodying high utility in use for electric, magnetic and/or optical devices and sensors.

Specifically, silver 'Ag' has the highest electrical and thermal conductivities among all metals and exhibits the highest surface-enhanced Raman efficiency in a visible region, thereby embodying excellent optical properties.

In the case where Ag is formed into a nanowire, high development may be expected in a variety of applications including micro-electronic devices and/or transparent electrodes, and so forth. Moreover, utilization thereof in optical, chemical and/or biological sensors may also be anticipated.

However, in order to utilize Ag nanowires in various applications, it is very important to provide technologies for mass-production of nanowires having a uniform thickness, a clear surface, a high aspect ratio, well-defined dimension, a small size deviation, etc., under simplified conditions.

As described above, although Ag nanowires has high utility for electric, magnetic and/or optical devices and sensors, for instance, a method for synthesis of Ag nanowires using a liquid chemical process commonly used in the related art, disclosed in US Laid-Open Patent No. 2007-0034052, entails problems such as difficulties in controlling a size and/or morphology of the nanowires, a significant size deviation of the fabricated nanowires, an extended reaction time, extreme difficulty in mass-production, and so forth.

SUMMARY

The present invention is directed to providing a method for producing Ag nanowire, using a liquid chemical process at an atmospheric pressure and low temperature with a very high efficiency within a very short period of time. Another object of the present invention is to provide a method for producing Ag nanowire having a uniform diameter, a small diameter deviation of the fabricated nanowire, a length of 5 μm or more and a high aspect ratio. Another object of the present invention is to provide a method for producing Ag nanowires, which includes effectively decreasing an amount of Ag precursor discarded without reaction to prepare Ag nanowires with high efficiency and conducting mass-production of such Ag nanowires through a simple scale-up. A further object of the present invention is to provide a method for producing Ag nanowires, which includes preventing formation of Ag products in undesired shapes such as Ag nanoparticles, Ag nanoplates and/or Ag nanorods while preparing Ag nanowires with high efficiency, and enabling mass-production of such Ag nanowires.

Hereinafter, the production method of the present invention will be described in detail with reference to the accompanying drawings. Such drawings are provided to sufficiently convey the spirit of the present invention to those skilled in the related art. Here, the scientific and/or technological terminologies used herein have the meanings understood by those having ordinary knowledge in the related art, unless the context clearly indicated otherwise. Further, the description of functions and/or technical configurations already well known in the art, which may undesirably obscure the essential configurations of the present invention, will be omitted from the following descriptions and/or accompanying drawings.

A method for producing Ag nanowires according to the present invention may include heating a precursor solution that includes: an Ag salt; a water-soluble polymer; a surfactant or a metal catalyst comprising a halide of metal ions having a standard reduction potential of −0.1 to −0.9V; and a reduction solvent, to produce Ag nanowires.

With regard to the production method of the present invention (hereinafter, often referred to as 'the inventive method') by heating the precursor solution that includes the Ag salt, water-soluble polymer, metal catalyst and reduction solvent to produce the Ag nanowires, the reduction solvent may be a polar solvent containing at least one oxygen atom.

More particularly, the reduction solvent may be selected from ethyleneglycol, diethyleneglycol, 1,2-propyleneglycol, 1,3-propyleneglycol, glycerol and glucose. This is for the purpose of regulating diameter and length of each nanowire, reaction rates, etc. by controlling the reduction potential.

The inventive method may use the surfactant to enable mass-production of Ag nanowires in a very short term, even at scale-up, and have advantages in that at least 90 mole % of Ag in the Ag salt introduced is converted into Ag nanowires and Ag nanowires having a uniform size may be produced using a high concentration Ag precursor solution.

The inventive method may also be characterized in that an amount of Ag nanowires is 95 wt. % or more, more particularly, 99 wt. % or more, among a total weight of an Ag product synthesized using the metal catalyst described above.

The surfactant used herein may be at least one selected from an anionic surfactant, a cationic surfactant and an amphoteric surfactant.

More particularly, the anionic surfactant may be a carboxylate salt, a sulfate salt, a sulfonate salt or a mixture thereof, preferably, may be represented by any one of the following Formula 1, 2 or 3:

Formula 1

Formula 2

Formula 3

(wherein $R_1$ is each independently, alkyl having 10 to 20 carbon atoms or alkenyl having 10 to 20 carbon atoms; n is an integer of 1 to 5; $R_2$ is an alkyl having 12 to 20 carbon atoms, an alkenyl having 12 to 20 carbon atoms or an alkylaryl having 12 to 20 carbon atoms.)

The cationic surfactant may be an amine salt containing primary to tertiary amine in a hydrophilic part thereof, a quaternary ammonium salt, an onium compound, or a mixture thereof, wherein the quaternary ammonium salt includes a nitrogen-containing heterocyclic compound among cyclic nitrogen compounds as well as a nitrogen-containing compound bonded to an alkyl chain. The onium compound may include phosphonium, sulfonium salts, or a mixture thereof, and the nitrogen-containing heterocyclic compound may include a pyridinium salt, quinolinium, imidazolium, or a mixture thereof.

Preferably, the cationic surfactant may be at least one selected from: ester-containing quaternary ammonium salts (EQ); amide group and ester group in quaternary ammonium salts; pyridinium derivatives, betaine derivatives, imidazolium derivatives, quinolinium derivatives, piperazinium derivatives and motpholinium derivatives.

The surfactant may be any one commercially available on the market and, for example, purchasable products of AK Chemtech: LDBAC (ASCO®), IMG (ASCO®), EQ (ASCO®), EAQ (ASCO®), CTAC (ASCO®), 24-3/28 (ASCO®), 1416 (ASCO®), BT (ASCO®) or ZW (ASCO®)

More particularly, the anionic surfactant may be at least one selected from sodium laureth sulfate, sodium (C14-C16) olefin sulfonate and sodium dodecyl benzene sulfonate.

The cationic surfactant may be at least one selected from compounds represented by the following Formulae 4, 5, 6, 7, 8, 9 and 10.

(wherein $R_3$, $R_4$, $R_6$ and $R_{10}$ are each independently, alkyl having 1 to 5 carbon atoms; $R_5$, $R_7$, $R_8$, $R_9$ and $R_{13}$ are each independently, alkyl having 10 to 20 carbon atoms or alkenyl having 10 to 20 carbon atoms; $R_{11}$ is an alkyl having 12 to 20 carbon atoms or alkenyl having 12 to 20 carbon atoms; $R_{12}$ is an alkyl having 1 to 3 carbon atoms; p and q are each independently integer of 1 to 4; $W_1$, $W_2$, $W_3$ and $W_4$ are each independently, O, S or NH; $X_1^-$, $X_2^-$, $X_3^-$, $X_4^-$, $X_5^-$ and $X_6^-$ are each independently, $Cl^-$ or $CH_3OSO_3^-$).

The amphoteric surfactant may be at least one selected from compounds represented by the following Formulae 11 and 12.

(wherein $R_{14}$ and $R_{17}$ are each independently, alkyl having 12 to 20 carbon atoms or alkenyl having 12 to 20 carbon atoms; $R_{15}$ is $COO^-$, $PO_3H^-$ or $SO_3^-$; $R_{16}$ is hydrogen, alkyl having 1 to 10 carbon atoms or alkenyl having 1 to carbon atoms; $R_{18}$ is $OCOO^-$, $OPO_3H^-$, $OSO_3^-$ or $SO_3^-$; r, s and t are each independently integer of 1 to 5; $X_7^-$ and $X_8^-$ are each independently $Cl^-$ or $CH_3OSO_3^-$; $Y_1^+$ and $Y_2^+$ are each independently $Na^+$, $K^+$ or $Li^+$).

According to the inventive method, the surfactant shows the greatest influence upon reaction rates during the synthesis of Ag nanowires and, moreover, may influence the shape of an Ag product obtained by reaction, a deviation in the size of Ag nanowire (diameter, length), possibility of mass-production through scale-up, reaction efficiency during the synthesis of nanowires, and so forth.

More specifically, adopting the surfactant described in the present invention may produce Ag in a nanowire shape for a very short period of time (within 30 minutes) even in the case of mass-production, increase synthesis yield of Ag nanowires, and uniformly control a size of plural Ag nanowires simultaneously formed by single synthesis.

Further, when Ag nanowires are synthesized according to the inventive method, productivity of Ag nanowires may be noticeably improved through simple scale-up, without significant alteration in techniques. In addition, reaction efficiency (that is, conversion efficiency) from an Ag salt introduced in the reaction to Ag nanowire may be remarkably increased.

More specifically, adopting the surfactant described in the present invention may attain noticeably high conversion efficiency wherein 90 mole % or more of Ag introduced in an Ag salt form is converted into Ag nanowires. Further, adopting the surfactant described in the present invention may considerably reduce a synthesis time for producing Ag nanowires and, even in the case of mass-production through scale-up, in turn producing the Ag nanowires in large quantities in a very short time, that is, within 30 minutes.

A ratio by weight of Ag salt to surfactant (Ag salt:surfactant) may range from 100:0.01 to 15 and, more preferably, 100:1 to 15. If an amount of the surfactant is less than 0.01 parts by weight, based on 100 parts by weight of the Ag salt, addition of the surfactant has difficulties in imparting effects. On the other hand, when the amount exceeds 15 part by weight, there is a risk of failing in synthesizing Ag nanowires and adverse influence such as contamination may be encountered.

According to the inventive method, since the precursor solution contains a halide of metal ions having a standard reduction potential ranging from −0.1 to −0.9V, synthesis of Ag products other than nanowires may be prevented, while Ag nanowires having an aspect ratio of 100 or more may be fabricated.

If the standard reduction potential of the metal ions in the metal catalyst, that is, the metal halide exceeds −0.1V or less than −0.9V, a synthesis rate of Ag nanowires may be considerably reduced.

Specifically, the metal ions described above may be at least one selected from $Ni^{2+}$ (standard reduction potential: −0.25V), $Co^{2+}$ (standard reduction potential: −0.29V), $Cr^{3+}$ (standard reduction potential: −0.408V) and $Zn^{2+}$ (standard reduction potential: −0.763V), and the metal catalyst may be a halide of at least one ion selected from $Ni^{2+}$, $Co^{2+}$, $Cr^{3+}$ and $Zn^{2+}$, and such halide may include chloride, bromide, fluoride, iodide or a mixture thereof. In this regard, in order to improve a synthesis rate of Ag nanowires within a short term, the halide is preferably chloride.

According to the inventive method, a ratio by weight of Ag salt:metal catalyst ranges from 100:0.01 to 1 and, preferably, the ratio by weight of Ag salt:metal catalyst ranges from 100:0.01 to 0.2.

The ratio by weight of Ag salt:metal catalyst means a ratio at which, among Ag products formed by reaction, formation of Ag nanoparticles, Ag nanoplates and Ag nanorods can be inhibited while selectively preparing Ag nanowires, regardless of reaction scale in the synthesis of Ag nanowires.

According to the present invention, in addition to the surfactant or metal catalyst described above, a length of Ag nanowire may be increased by controlling a molecular weight of a water-soluble polymer.

More particularly, the water-soluble polymer is attached to a side of the Ag nanowire and serves to grow the wire during the production of the Ag nanowire and, by increasing the molecular weight (Mw) of the water-soluble polymer as well as the metal catalyst of the present invention, Ag nanowire having an elongated length may be produced while preventing an increase in diameter of the nanowire. More specifically, by controlling the molecular weight (Mw) of the water-soluble polymer to a range of 50,000 to 1,500,000, Ag nanowires having an average length of 30 μm to 70 μm may be produced.

The water-soluble polymer may be at least one selected from polyvinyl pyrrolidone, polyvinyl alcohol, polyacrylamide, polyacrylic acid and copolymers thereof and, more preferably, polyvinyl pyrrolidone.

In order to produce Ag nanowires having a length of 10 μm or more and a very high aspect ratio, nucleation of excessive Ag nuclei should be controlled at the initial reaction, and the formed Ag nuclei should be combined with dissolved Ag ions, thus rapidly growing in a predetermined direction.

The production method of the present invention is characterized in that controlling agitation conditions and viscosity of the precursor solution while heating the precursor solution as well as the surfactant or metal catalyst described above may regulate a length and aspect ratio of the produced Ag nanowire.

More particularly, the inventive method is further characterized in that controlling agitation conditions while heating the precursor solution as well as the surfactant or metal catalyst described above may increase a long axis direction (hereinafter, 'length') of the Ag nanowire.

Moreover, controlling the viscosity of the precursor solution may reduce a short axis direction (hereinafter, 'diameter') of the Ag nanowire.

With regard to the inventive method, the precursor solution may be under a non-agitated state or satisfy the following Relation 1 in the production of the Ag nanowire by heating the precursor solution:

$$0 < V \leq 50 \text{ cm/sec} \qquad \qquad \text{Relation 1}$$

(V is an average flow rate of a precursor solution).

The non-agitated state means a condition without artificial agitation, in particular, a condition that neither exhibits a variation in flow rate due to an external apparatus nor occurs turbulence, instead, includes natural convection in the solution.

The production method of the present invention may regulate a (long axis) length of the produced Ag nanowire under the non-agitated state or by controlling the agitation state of the precursor solution to satisfy Relation 1. Preferably, the Ag nanowire having a uniform size with a length of 10 μm or more, more particularly, 20 μm or more, is more preferably produced.

According to the inventive method, the precursor solution may further include a viscosity enhancer and the Ag nanowire with controlled diameter may be produced using the viscosity enhancer.

Specifically, a content of the viscosity enhancer in the precursor solution may be an amount satisfying that a mixture of the viscosity enhancer and a reduction solvent has viscosity of 1.1 to 10 times viscosity of the reduction solvent. Since very tiny Ag nuclei are created in the viscosity enhancer while lateral growth thereof (growth in a direction perpendicular to a length direction) is inhibited, Ag nanowires having a short axis length (that is, the diameter) of 50 nm or less and, substantially, ranging from 20 to 50 nm, may be produced.

In order to control the lateral growth of Ag nuclei while inhibiting nucleation thereof, the viscosity enhancer is preferably polyethylene glycol and the polyethylene glycol has a molecular weight of 200 to 20,000.

As described above, according to the inventive method, Ag nanowires having a uniform size may be produced with high conversion efficiency in a short term by using the surfactant described above. Here, the length of the Ag nanowire may be controlled by agitating the foregoing precursor solution, while the diameter of the Ag nanowire may be controlled using the foregoing viscosity enhancer.

As described above, according to the inventive method, using the surfactant may produce Ag nanowires having a uniform size with high conversion efficiency in a short term. On the other hand, using the metal catalyst may produce Ag nanowires having an aspect ratio of 100 or more while preventing formation of undesired products such as Ag nanorods, Ag nanoparticles and Ag nanoplates, except for Ag nanowires. Depending upon the agitation state of the precursor solution, the length of the Ag nanowire may be regulated while the viscosity enhancer may regulate the diameter of the Ag nanowire.

For example, using the surfactant may produce Ag nanowires having an average diameter of 60 to 90 nm and an average length of 5 to 9 μm. Also, controlling the agitation state of the precursor solution and using the surfactant and may produce Ag nanowires having an average diameter of 40 to 70 nm and an average length of 10 μm or more and, more specifically, ranging from 20 to 100 μm. Further, controlling the agitation state of precursor solution and using the surfactant and the viscosity enhancer may produce Ag nanowires having an average diameter of 20 to 50 nm and an average length of 10 μm or more and, more specifically, ranging from 20 to 50 μm.

For example, using the metal catalyst may produce Ag nanowires having an average diameter of 60 to 80 nm and an average length of 5 μm or more and, more specifically, ranging from 8 to 20 μm. In addition, controlling the agitation state of the precursor solution and using the metal catalyst may produce Ag nanowires having an average length of 20 μm or more and, more specifically, ranging from 20 to 50 μm, and an average diameter of 70 to 100 nm. According to the agitation state of precursor solution and using the metal catalyst and the viscosity enhancer, Ag nanowires having an average diameter of 60 nm or less and, more specifically, ranging from 20 to 50 nm, and an average length of 20 μm or more and, more specifically, ranging from 20 to 60 μm, may be produced. Controlling the agitation state of the precursor solution and a molecular weight of the water-soluble polymer, and using metal catalyst, Ag nanowires having an average length of 30 μm or more and, more specifically, ranging from 30 to 70 μm, and an average diameter of 80 to 110 nm, may be produced.

More particularly, the method for producing Ag nanowires according to the present invention may comprise: (a) preparing a first solution that includes an Ag salt and a first reduction solvent, and a second solution that includes a surfactant or a metal catalyst, a water-soluble polymer, a viscosity enhancer and a second reduction solvent; (b) heating the second solution; and (c) introducing the first solution to the second solution to produce Ag nanowires. Here, after the operation (c), the above method may further include (d) another operation of recovering the produced Ag nanowires through solid-liquid separation.

That is, the inventive method adopts the surfactant or metal catalyst and, at the same time, uses the Ag salt as an Ag precursor for producing the Ag nanowire. In this regard, the inventive method is characterized in that: the Ag precursor and the surfactant or, otherwise, the Ag precursor and the metal catalyst are isolated and dissolved to form a solution; the solution containing the surfactant or metal catalyst dissolved therein is selectively heated; and the above solution containing the surfactant or metal catalyst dissolved therein is mixed and reacted with the Ag precursor solution, to thereby produce the Ag nanowires.

More specifically, a heating temperature of the second solution executed in the operation (b) may satisfy the following Relation 2.

$$0.6Tb < Th < 0.9Tb \qquad \text{Relation 2}$$

(wherein Th is a heating temperature (° C.) of the second solution; Tb is a boiling point (° C.) of a lower alcohol (a lower alcohol of the second solution) at atmospheric pressure).

The heating temperature in Relation 2 may control the driving force for nucleation and growth of Ag. By controlling the temperature of the second solution in such a way that Relation 2 is satisfied, and using the surfactant of the present invention, Ag nanowires having a consistently uniform size may be produced in large quantities with high efficiency in a short reaction time, that is, within 30 minutes (which is required to complete a reaction after mixing the first and second solutions), even in mass-production through scale-up.

Here, the viscosity enhancer may be contained in the second solution and a content of the viscosity enhancer in the second solution may be an amount such that the second solution has a viscosity of 1.1 to 10 times the viscosity of the second reduction solvent in the second solution.

A technical configuration of selectively heating the second solution containing the surfactant and the viscosity enhancer, as well as a variation in the temperature of the second solution while mixing the second solution with the first solution, may influence quality and morphology of the produced Ag nanowires.

According to the inventive method, in operation (c), a temperature of the second solution set by heating in operation (b) is retained. That is, Ag nanowires may be produced by introducing the first solution to the second solution while maintaining the second solution in a heated condition.

Preferably, a variation in the temperature of the second solution while introducing the first solution in operation (c), may satisfy the following Relation 3 and, more preferably, Relation 3-1.

$$0 \leq \Delta T_2 \leq 0.1 T_2 \qquad \text{Relation 3}$$

(wherein $T_2$ is a temperature of the second solution by heating in operation (b); $\Delta T_2$ is a variation in the temperature of the second solution when the first solution is introduced to the second solution).

$$0 \leq \Delta T_2 \leq 0.05 T_2 \qquad \text{Relation 3-1}$$

(wherein $T_2$ is a temperature of the second solution by heating in operation (b); $\Delta T_2$ is a variation in the temperature of the second solution when the first solution is introduced to the second solution).

Specifically, $\Delta T_2$ is an absolute value of a value resulting from subtracting the temperature ($T_2$) by heating in operation (b) from a temperature ($T_1$) at a particular time during introduction of the first solution.

According to a characteristic of the present invention, the reaction is terminated within 30 minutes after completing introduction of the first solution. Also, after introducing the first solution, the temperature by heating in operation (b) is maintained during the reaction time, to thus satisfy Relation 2.

For this purpose, in operation (c) to add the first solution containing the Ag precursor to the heated second solution, the first solution is preferably discontinuously introduced to the second solution. Specifically, in operation (c), the first solution may be introduced dropwise in an amount of 0.01 to 5 vol. %/sec to the second solution, with reference to a volume (V1) of the first solution.

As described above, according to the inventive method, since the agitation state in operation (c) influences the morphology of the produced nanowires, Relation 3 and, more preferably, Relation 3-1 may be satisfied independently of the agitation state.

According to the present invention, in operation (c), the second solution may be under a non-agitated state or satisfy Relation 1-1 while introducing the second solution or during the reaction time.

$$0 < V_2 \leq 50 \text{ cm/sec} \quad \text{Relation 1-1}$$

(wherein $V_2$ is an average flow rate of the second solution).

Specifically, according to the present invention, while introducing the first solution and during the reaction time after the introduction, a long axis length (that is, the length) of the produced Ag nanowire may be regulated by controlling the agitation state of the second solution, and producing nanowires having a uniform size.

Since operation (c) is conducted under the non-agitated state of the second solution or in such a way to satisfy Relation 1-1, Ag nanowires having an average diameter of 40 to 70 nm and an average length of 10 μm or more and, more specifically, ranging from 20 to 100 μm may be produced in operation (c).

In Relation 1-1, the flow rate means an average flow rate of a fluid, that is, the second solution in operation (c). The non-agitated state means a condition without artificial agitation, in particular, a condition that neither exhibits a variation in flow rate nor occurs turbulence, instead, includes natural convection in the solution.

Preferably, with regard to the production method of the present invention that includes heating a precursor solution containing an Ag salt, a water-soluble polymer, a surfactant, a viscosity enhancer and a reduction solvent to produce Ag nanowires, the reduction solvent is a polar solvent containing at least one oxygen atom.

Specifically, the reduction solvent may be at least one selected from ethyleneglycol, 1,2-propyleneglycol, 1,3-propyleneglycol, diethyleneglycol (DEG) (2-hydroxyethyl ether), glycerol and glucose. This is for the purpose of regulating a diameter and/or length of a nanowire or controlling reaction rates by controlling the reduction force.

More specifically, the first reduction solvent to dissolve the Ag salt is at least one selected from ethyleneglycol, 1,2-propyleneglycol, 1,3-propyleneglycol, diethyleneglycol (DEG) (2-hydroxyethyl ether), glycerol and glucose. On the other hand, the second reduction solvent to dissolve the surfactant and the water-soluble polymer and, preferably, the surfactant, the water-soluble polymer and the viscosity enhancer, may be independent from the first reduction solvent and at least one selected from ethyleneglycol, 1,2-propyleneglycol, 1,3-propyleneglycol, diethyleneglycol (DEG) (2-hydroxyethyl ether), glycerol and glucose.

In an aspect of miscibility, the first reduction solvent may be the same material as the second reduction solvent. For instance, the first and second reduction solvents may be ethyleneglycol. The Ag salt may be any Ag salt dissolved in a reduction solvent and, for example, at least one selected from silver nitrate, silver acetate, silver perchlorate and silver chloride.

In production of Ag nanowires, the water-soluble polymer is adopted to be attached to a lateral side of an Ag nanowire and functions to grow the wire and, as described above, may be at least one selected from polyvinylpyrrolidone, polyvinylalcohol, polyacrylamide, polyacrylic acid, and copolymers thereof. A molecular weight (Mw) of the water-soluble polymer may range from 50,000 to 1,500,000.

According to the production method of the present invention, if the surfactant is included, the first solution containing the Ag precursor dissolved therein may include 15 to 40 wt. % of Ag salt. According to the present invention, using the first solution with a high content of precursor (Ag precursor) may produce Ag nanowires with high efficiency in a very short time. In this case, the second solution may include 1 to 15 wt. % of the water-soluble polymer and, further, 0.005 to 1 wt. % of the surfactant.

As described above, the first and second solutions may be mixed to satisfy a ratio by weight of Ag salt:surfactant ranging from 100:0.01 to 15. A content of the viscosity enhancer in the second solution may be an amount such that a solvent mixture has the viscosity (at 25° C.) of 1.1 to 10 times, based on the viscosity (at 25° C.) of the solvent mixture including the first reduction solvent and the second reduction solvent wherein the first and second reduction solvents have predetermined volumes in the first and second solutions, respectively.

According to the inventive method, if the metal catalyst is included, a content of Ag salt in the first solution containing the Ag precursor dissolved therein may range from 1 to 12 wt. %, while a content of the water-soluble polymer in the second solution may range from 0.5 to 12 wt. % and a content of the metal catalyst may range from 0.0001 to 0.02 wt. %.

As described above, the first solution and the second solution may be mixed to satisfy a ratio by weight of Ag salt:metal catalyst ranging from 100:0.01 to 1. A content of the viscosity enhancer in the second solution may be an amount such that a solvent mixture has the viscosity (at 25° C.) of 1.1 to 10 times, based on the viscosity (at 25° C.) of the solvent mixture including the first reduction solvent and the second reduction solvent wherein the first and second reduction solvents have predetermined volumes in the first and second solutions, respectively.

In addition to the surfactant, the viscosity enhancer and the agitation condition described above, a content of the Ag salt in the first solution, a content of the water-soluble polymer in the second solution, a content of the surfactant and a content of the metal catalyst may enable stable mass-production of Ag nanowires through simple scale-up.

The present invention provides a transparent electrode containing the Ag nanowire produced by the foregoing production method.

The transparent electrode may include a front electrode of a solar cell. Since the Ag nanowire produced according to the present invention has a high aspect ratio, controlled thickness, and uniform size, the transparent electrode of the present invention may exhibit excellent and uniform electrical conductivity by mixing Ag nanowires and applying the mixture to the electrode. Moreover, even when a small amount of Ag nanowires is contained, the transparent electrode may retain excellent electrical conductivity while having superior light transmission.

Other features and aspects will be apparent from the following detailed description, the drawings, and the claims.

DETAILED DESCRIPTION OF EMBODIMENTS

Hereinafter, preferred embodiments of the present invention will be described in detail.

Example 1

Synthesis of Ag Nanowire Using Cationic Surfactant

A first solution was prepared by dissolving 0.375 g of $AgNO_3$ (Kojima 99.9%) in 1 mL of ethyleneglycol (EG, viscosity at 25° C.=16.1 cp) at room temperature for 15 minutes. A second solution was prepared by dissolving 0.375 g of polyvinylpyrrolidone (PVP, Mw 55,000) and 0.023 g of betaine (Cocoamidopropyl bentaine, AK Chemtech, CAS registry No. 61789-40-0/83138-08-3) in 4 mL of ethyleneglycol (EG) at 75° C. for 10 minutes. Thereafter, the second solution was introduced into a 50 ml round-bottom flask and heated to 160° C. using an oil bath. Then, the first solution was introduced dropwise at a rate of 0.02 mL/sec to the heated second solution through a micro-pipette while agitating the second solution at 250 rpm. Here, it was confirmed that a variation in the temperature of the second solution was maintained within ±3° C. while dropping the first solution.

5 minutes after the addition of the first solution was completed, it was observed that a color of the mixed solution changed into milky white, followed by cooling it to room temperature to terminate the reaction.

Next, excessive acetone (40 mL) was added to the solution obtained after completing the reaction to enable precipitation, followed by centrifuging to settle Ag nanowires. After discarding a solvent layer, acetone was added again to the residue to re-disperse the Ag nanowires and centrifuging and removal of the solvent were repeated twice, thereby recovering the produced Ag nanowires.

Example 2

Mass-Production Using Cationic Surfactant Through Scale-Up

A first solution was prepared by dissolving 56.25 g of $AgNO_3$ (Kojima 99.9%) in 150 mL of ethyleneglycol (EG) at room temperature for 20 minutes. A second solution was prepared by dissolving 56.25 g of polyvinylpyrrolidone (PVP, Mw 55,000) and 3.45 g of betaine (Cocamidopropyl bentaine, AK Chemtech, CAS registry No. 61789-40-0/83138-08-3) in 600 mL of ethyleneglycol (EG) at 75° C. for 30 minutes.

Thereafter, the second solution was introduced into a 2 L reactor having a diameter of 20 cm and heated to 160° C. using an oil bath. Then, the first solution was introduced dropwise at a rate of 0.08 mL/sec to the heated second solution through a micro-pipette while agitating the second solution at 250 rpm. Here, it was confirmed that a variation in the temperature of the second solution was maintained within ±5° C. while dropping the first solution.

10 minutes after the addition of the first solution was completed, it was observed that a color of the mixed solution changed into milky white, followed by cooling it to room temperature to terminate the reaction.

Next, a process of recovering Ag nanowires was performed by the same procedures as described in Example 1.

Example 3

Synthesis of Ag Nanowire Using Anionic Surfactant

A first solution was prepared by dissolving 0.375 g of $AgNO_3$ (Kojima 99.9%) in 1 mL of ethyleneglycol (EG) at room temperature for 15 minutes. A second solution was prepared by dissolving 0.375 g of polyvinylpyrrolidone (PVP, Mw 55,000) and 0.023 g of SLES (sodium laureth sulfate, AK Chemtech, ASCO® 24-3/28, 68585-34-2) in 4 mL of ethyleneglycol (EG) at 75° C. for 10 minutes.

Thereafter, the second solution was introduced into a 50 ml round-bottom flask and heated to 160° C. using an oil bath. Then, the first solution was introduced dropwise at a rate of 0.02 mL/sec to the heated second solution through a micro-pipette while agitating the second solution at 250 rpm. Here, it was confirmed that a variation in the temperature of the second solution was maintained within ±3° C. while dropping the first solution.

5 minutes after the addition of the first solution was completed, it was observed that a color of the mixed solution changed into milky white, followed by cooling it to room temperature to terminate the reaction.

Next, a process of recovering Ag nanowires was substantially conducted by the same procedures as described in Example 1.

Example 4

Mass-Production Using Anionic Surfactant Through Scale-Up

A first solution was prepared by dissolving 56.25 g of $AgNO_3$ (Kojima 99.9%) in 150 mL of ethyleneglycol (EG) at room temperature for 20 minutes. A second solution was prepared by dissolving 56.25 g of polyvinylpyrrolidone (PVP, Mw 55,000) and 3.45 g of SLES (sodium laureth sulfate, AK Chemtech, ASCO® 24-3/28, 68585-34-2) in 600 mL of ethyleneglycol (EG) at 75° C. for 30 minutes.

Thereafter, the second solution was introduced into a 2 L reactor having a diameter of 20 cm and heated to 150° C. using an oil bath. Then, the first solution was introduced dropwise at a rate of 0.08 mL/sec to the heated second solution through a micro-pipette while agitating the second solution at 250 rpm. Here, it was confirmed that a variation in the temperature of the second solution was maintained within ±5° C. while dropping the first solution.

10 minutes after the addition of the first solution was completed, it was observed that a color of the mixed solution changed into milky white, followed by cooling it to room temperature to terminate the reaction.

Next, a process of recovering Ag nanowires was substantially conducted by the same procedures as described in Example 1.

Example 5

Synthesis of Ag Nanowire Using Surfactant without Agitation

Ag nanowires were produced by the same procedures as described in Example 1, except that the second solution in Example 1 was heated to 160° C. and the first solution was introduced dropwise at a rate of 0.02 mL/sec to the heated second solution through a micropipette without agitating the second solution.

Example 6

Synthesis of Ag Nanowire Using Surfactant and Viscosity Enhancer

Ag nanowires were produced by the same procedures as described in Example 1, except that: the second solution in Example 1 was prepared using 3.5 mL of ethyleneglycol and 0.5 mL of polyethyleneglycol (PEG, Mw 55,000), instead of 4 mL of ethyleneglycol; the prepared second solution was heated to 160° C.; and the first solution was introduced dropwise at a rate of 0.02 mL/sec to the heated solution through a micropipette without agitating the second solution. Here, a solvent mixture comprising 4.5 mL of ethyleneglycol and 0.5 mL of polyethyleneglycol showed a viscosity of 20 cp at 25° C.

Example 7

Synthesis of Ag Nanowire Using Surfactant with Low Speed Agitation

Ag nanowires were produced by the same procedures as described in Example 2, except that: the second solution in Example 2 was prepared using 525 mL of ethyleneglycol and 75 mL of polyethyleneglycol (PEG, Mw 55,000), instead of 600 mL of ethyleneglycol; the prepared second solution was heated to 160° C.; and the first solution was introduced dropwise at a rate of 0.08 mL/sec to the heated solution through a micropipette while agitating the second solution at 30 rpm. Here, a solvent mixture comprising 675 mL of ethyleneglycol and 75 mL of polyethyleneglycol showed a viscosity of 20 cp at 25° C.

Example 8

Synthesis of Ag nanowire Using Metal Catalyst

A first solution was prepared by dissolving 0.17 g of $AgNO_3$ (Kojima 99.9%) in 10 mL of ethyleneglycol (EG, viscosity at 25° C.=16.1 cp) at room temperature for 15 minutes. A second solution was prepared by dissolving 0.17 g of polyvinylpyrrolidone (PVP, Mw 55,000) and 0.2 mg of $NiCl_2.6H_2O$ in 10 mL of ethyleneglycol (EG) at room temperature.

Thereafter, the second solution was introduced into a 50 ml round-bottom flask having a diameter of 0.5 cm and heated to 160° C. using an oil bath. Then, the first solution was introduced dropwise at a rate of 0.05 mL/sec to the heated second solution through a micro-pipette, while agitating the second solution at 800 rpm. Here, it was confirmed that a variation in the temperature of the second solution was maintained within ±3° C. while dropping the first solution.

15 minutes after the addition of the first solution was completed while maintaining agitation, it was observed that a color of the mixed solution changed into milky white, followed by cooling it to room temperature to terminate the reaction.

Next, excessive acetone (40 mL) was added to the solution obtained after completing the reaction to enable precipitation, followed by centrifuging to settle Ag nanowires. After discarding a solvent layer, acetone was added again to the residue to re-disperse the Ag nanowires and centrifuging and removal of the solvent were repeated twice, thereby recovering the produced Ag nanowires.

In this case, it was confirmed that 99 wt. % or more of the product recovered through centrifuging is the Ag nanowire product.

Example 9

Synthesis of Ag Nanowire Using Metal Catalyst with Non-Agitation

Ag nanowires were produced by the same procedures as described in Example 8, except that the first solution was added without agitation of the second solution and the addition of the first solution with non-agitation and the reaction were completed.

Example 10

Synthesis of Ag Nanowire Using Metal Catalyst and Water-Soluble Polymer with Non-Agitation Ag nanowires were produced by the same procedures as described in Example 9, except that PVP (Mw 1,000,000) is used instead of PVP (Mw 55,000).

Example 11

Synthesis of Ag Nanowire Using Metal Catalyst and Viscosity Enhancer with Low Speed Agitation Ag nanowires were produced by the same procedures as described in Example 9, except that: the first solution was prepared by dissolving 0.17 g of $AgNO_3$ (Kojima 99.9%) in 10 mL of ethyleneglycol (EG) at room temperature for 15 minutes; the second solution was prepared by dissolving 0.17 g of polyvinylpyrrolidone (PVP, Mw 360,000), 0.1 mg of $ZnCl_2$ and 5 ml of polyethyleneglycol (PEG, Mw 400) in 10 ml of ethyleneglycol (EG) at room temperature; and the first solution was added to the second solution while agitating the second solution at 30 rpm, and the reaction was maintained at 30 rpm.

Here, the solvent comprising 10 mL of ethyleneglycol and 5 mL of polyethyleneglycol had a viscosity of 40 cp at 25° C. while the solvent comprising 20 mL of ethyleneglycol and 5 mL of polyethyleneglycol had a viscosity of 30 cp at 25° C.

Comparative Example

Synthesis of Ag Nanowire Using Metal Catalyst with Standard Reduction Potential of 0.769V A first solution was prepared by dissolving 0.17 g of AgNO$_3$ (Kojima 99.9%) in 10 mL of ethyleneglycol (EG) at room temperature for 15 minutes. A second solution was prepared by dissolving 0.17 g of polyvinylpyrrolidone (PVP, Mw 55,000) and 0.1 mg of FeCl$_3$ in 10 mL of ethyleneglycol (EG) at room temperature.

Thereafter, the second solution was heated to 160° C. using an oil bath. Then, the first solution was introduced dropwise at a rate of 0.05 mL/sec to the heated second solution through a micro-pipette, while agitating the second solution at 800 rpm. Here, it was confirmed that a variation in the temperature of the second solution was maintained within ±3° C. while dropping the first solution.

15 minutes after the addition of the first solution was completed while maintaining agitation, it was observed that a color of the mixed solution changed into milky white, followed by cooling it to room temperature to terminate the reaction.

Next, excessive acetone (40 mL) was added to the solution obtained after completing the reaction to enable precipitation, followed by centrifugation. Such a procedure was repeated twice, thereby recovering the produced Ag nanowires.

Figure 1:
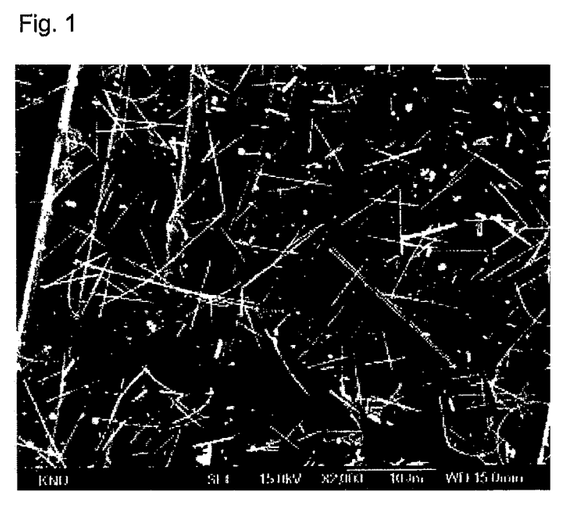
FIG. 1 is a scanning electron microscope (SEM) image of Ag nanowire produced in Example 1.

FIG. 1 is an SEM image observing the Ag nanowire produced in Example 1 and, as shown in FIG. 1, it can be seen that the Ag nanowires having a very uniform size are produced in large quantities. As a result of observing through SEM, it was confirmed that the Ag nanowire has an average diameter of 70 nm, an average length of 7 μm and a length deviation of 8.77, which in turn indicates a deviation of not more than 70.76% to the average length, thus demonstrating a uniform size of the Ag nanowire. Moreover, it was identified that 94% of the introduced Ag salt in the reaction is converted into Ag nanowires.

Figure 2:
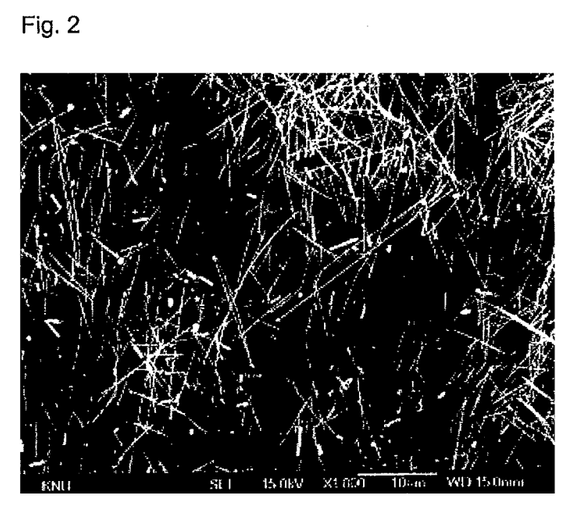
FIG. 2 is an SEM image of Ag nanowire produced in Example 2.

FIG. 2 is an SEM image of the Ag nanowire produced in Example 2. From this figure, it can be seen that the Ag nanowires having a uniform size are produced even after scale-up, similar to Example 1. Moreover, it can be seen that the Ag nanowires are produced in large quantities in a short time, that is, within 30 minutes and, in the case of the examples, a great amount of the Ag nanowires having a length of several μm, was provided in a very short time, that is, within 10 minutes.

Figure 3:
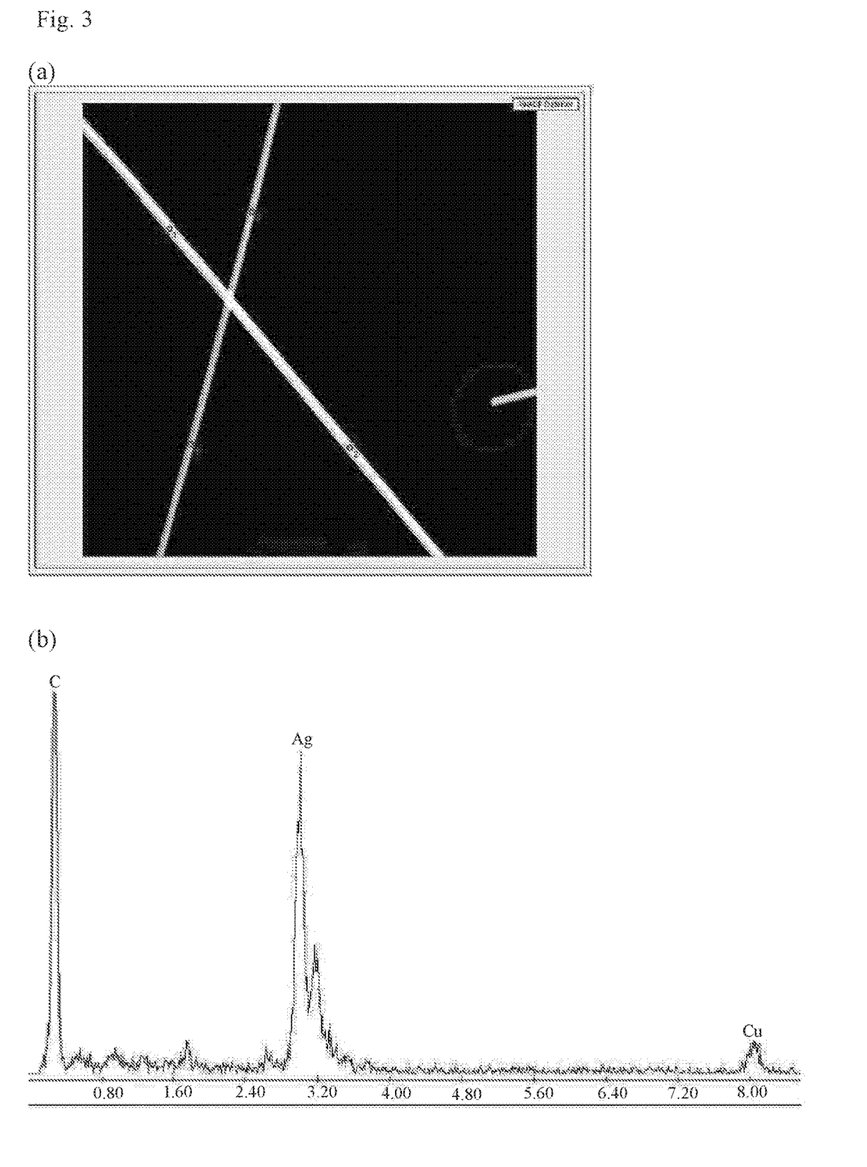
FIG. 3 is an SEM image of Ag nanowire produced in Example 1 and EDS results.

FIG. 3($a$) is an SEM image of the Ag nanowire produced in Example 1, while FIG. 3($b$) shows EDS (energy dispersive spectroscopy) results measured in regions 1 to 4 shown in FIG. 3($a$). Similar results were obtained from all the regions of all of the produced Ag nanowires. In addition, Ag only was detected other than a further added component (Cu) for analysis, such as a coating material.

Figure 4:
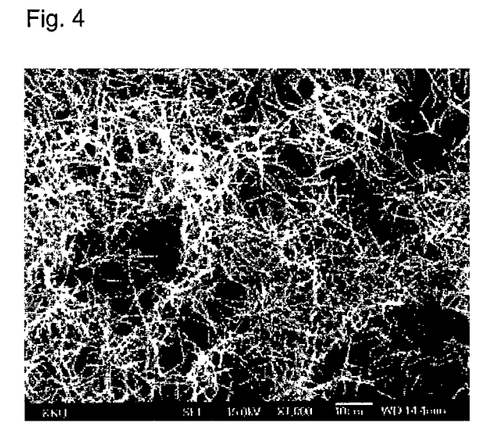
FIG. 4 is an SEM image of Ag nanowire produced in Example 3.
Figure 5:
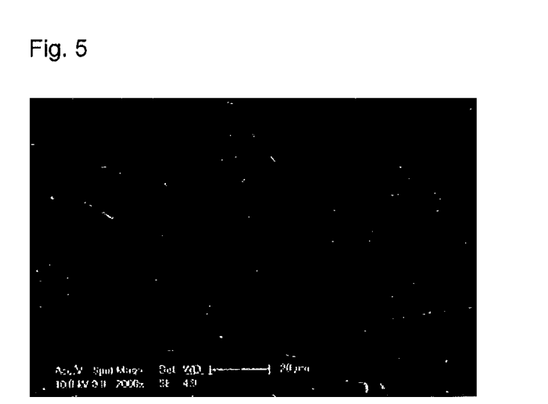
FIG. 5 is an SEM image of Ag nanowire produced in Example 4.

FIG. 4 is an SEM image observing the Ag nanowire produced in Example 3 and FIG. 5 is an SEM image observing the Ag nanowire produced in Example 4. Compared to the case of using the cationic surfactant, similar results were obtained even using an anionic surfactant. Also, it can be seen that a great amount of Ag nanowires is produced with high efficiency for a short time through simple scale-up.

Figure 6:
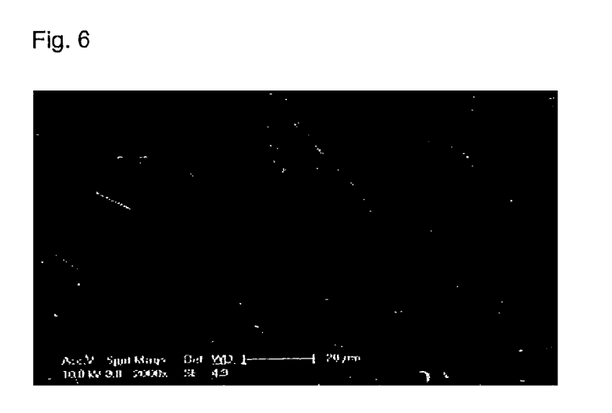
FIG. 6 is an SEM image of Ag nanowire produced in Example 5.

FIG. 6 is an SEM image observing the Ag nanowire produced in Example 5. From this figure, it was confirmed that the Ag nanowire was produced under non-agitation and the produced Ag nanowire has an average diameter of 50 nm and an average length of 80 μm.

Figure 7:
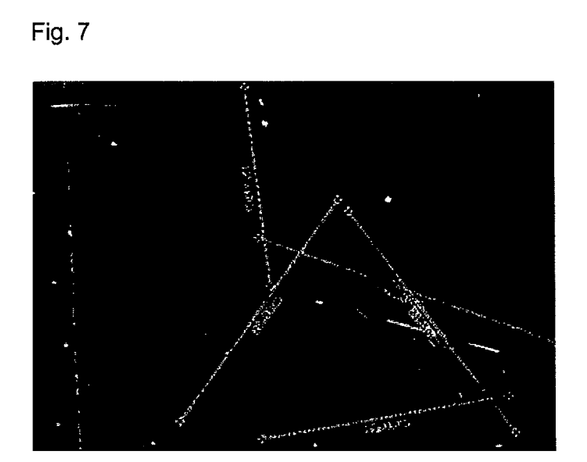
FIG. 7 is an SEM image of Ag nanowire produced in Example 6.
Figure 8:
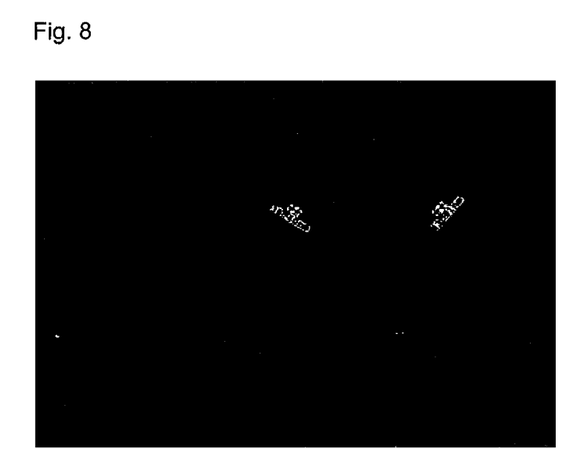
FIG. 8 is a high magnification SEM image of Ag nanowire produced in Example 6.

FIGS. 7 and 8 are SEM images observing the Ag nanowire produced in Example 6. As shown in FIG. 7, it can be seen that a great amount of Ag nanowires having a very uniform size is produced. Observed results through SEM showed that the Ag nanowire having an average diameter of 40 nm and an average length of 30 μm as well as a uniform size was produced.

Figure 9:
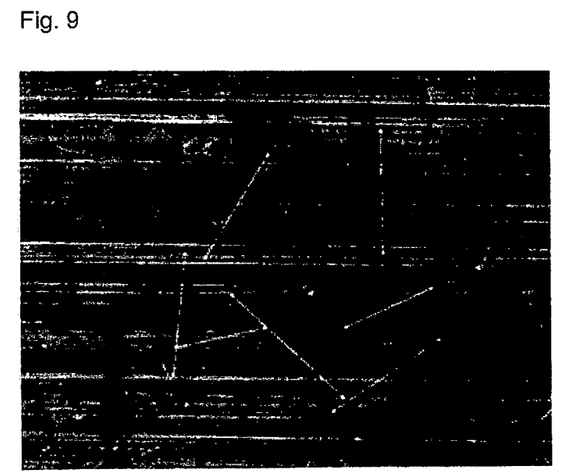
FIG. 9 is an SEM image of Ag nanowire produced in Example 7.

FIG. 9 is an SEM image observing the Ag nanowire produced in Example 7. As shown in FIG. 9, it was confirmed that the nanowire produced under low speed agitation has an average diameter of 40 nm and an average length of 20 μm.

Figure 10:
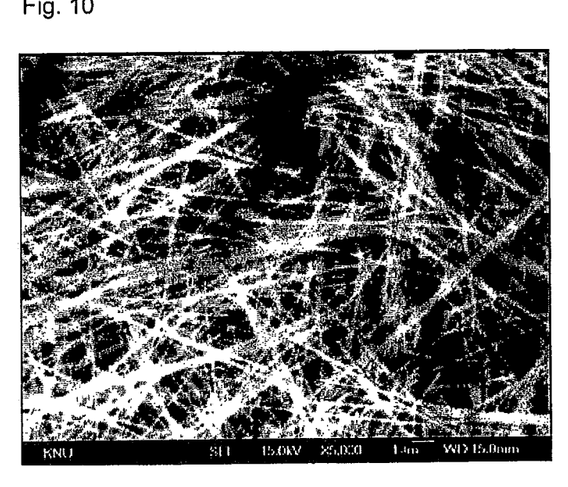
FIG. 10 is an SEM image of Ag nanowire produced in Example 8.

FIG. 10 is an SEM image of the Ag nanowire produced in Example 8. From the figure, it was confirmed that the Ag nanowire having a uniform size with an average short axis diameter of 70 nm and an average length of 10 μm was produced.

Figure 11:
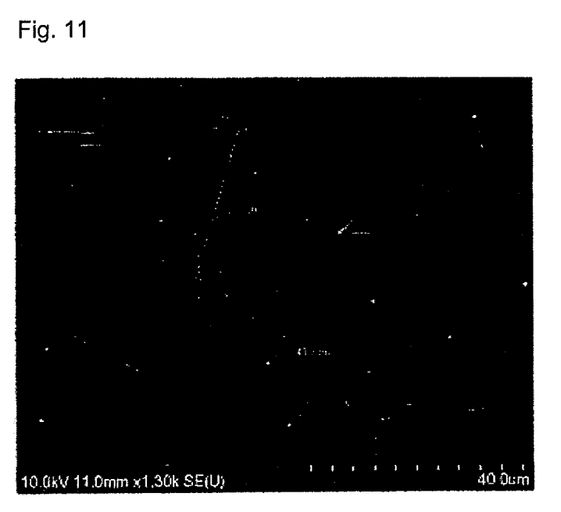
FIG. 11 is an SEM image of Ag nanowire produced in Example 9.

FIG. 11 is an SEM image of the Ag nanowire produced in Example 9. From the figure, it was confirmed that the Ag nanowire having a uniform size with an average short axis diameter of 90 nm and an average length of 35 μm was produced.

Figure 12:
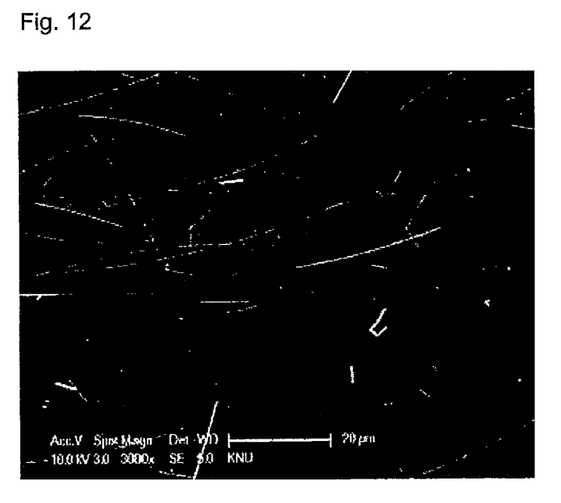
FIG. 12 is an SEM image of Ag nanowire produced in Example 10.

FIG. 12 is an SEM image of the Ag nanowire produced in Example 10. From the figure, it was confirmed that the Ag nanowire having a uniform size with an average short axis diameter of 100 nm and an average length of 50 μm was produced.

Figure 13:
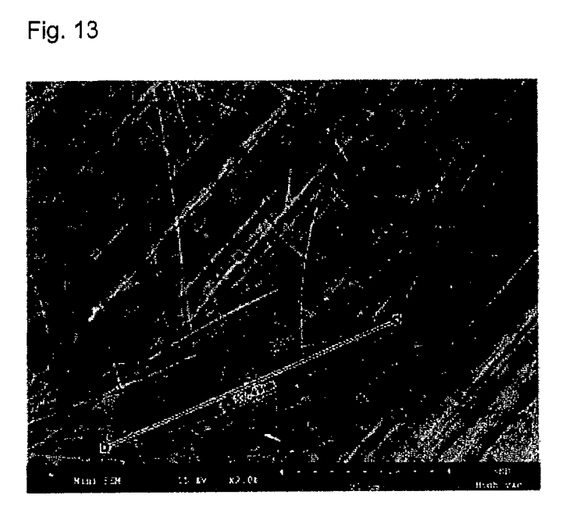
FIG. 13 is an SEM image of Ag nanowire produced in Example 11.
Figure 14:
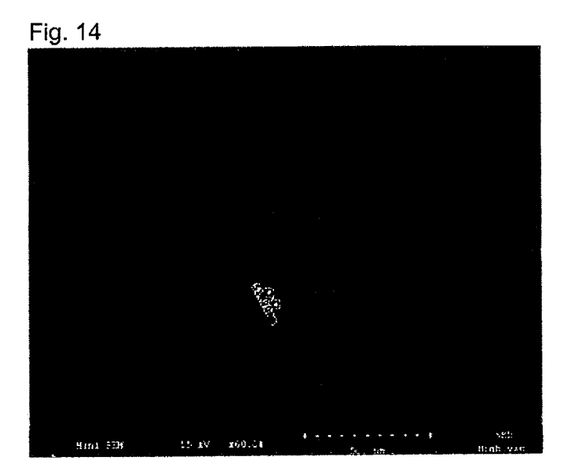
FIG. 14 is a high magnification SEM image of Ag nanowire produced in Example 11.

FIGS. 13 and 14 are SEM images of the Ag nanowire produced in Example 11. From the figures, it was confirmed that the Ag nanowire having a uniform size with an average short axis diameter of 50 nm and an average length of 30 μm was produced.

Figure 15:
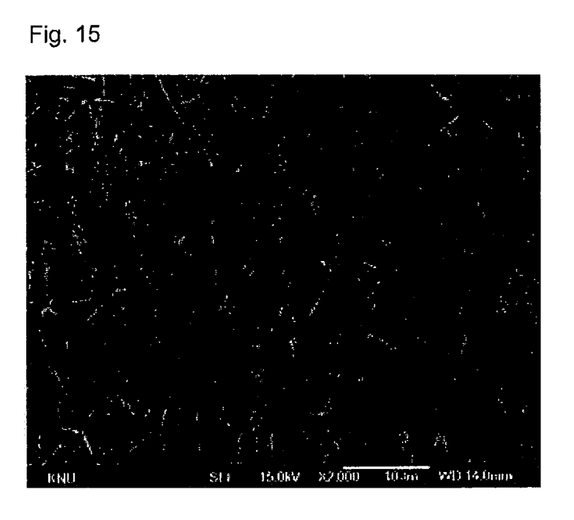
FIG. 15 is an SEM image of Ag nanowire produced in Comparative Example.

FIG. 15 is an SEM image of the Ag nanowire produced in Comparative Example. From the figure, it can be seen that the Ag nanowire having an average diameter of 150 nm, an average length of 8 μm and an aspect ratio of 53 is produced. Moreover, it was confirmed that the percentage by weight of the Ag nanowire, among the product recovered through centrifuging, was 50 wt. % or less.

As set forth above, the production method of the present invention may remarkably increase an amount of Ag nanowires through a simple scale-up without considerable technical alteration. In addition, by surprisingly shortening a synthesis time, Ag nanowires may be produced in large quantities for a very short time within 30 minutes even in mass-production through scale-up. The inventive method is also characterized in that: nanowires having a uniform length with a standard deviation within 30% of the average length may be produced; the length and the diameter of Ag nanowire may be independently regulated; 90 mole % or more of Ag salt introduced during a reaction may be formed into Ag nanowires; formation of undesired products including Ag nanorods, Ag nanoparticles and/or Ag nanoplates, except for Ag nanowires, may be prevented; and Ag nanowires having a uniform size and an average aspect ratio of 100 or more may be produced.

As described above, the present invention has been explained by the detailed description, exemplary embodiments and accompanying drawings, however, these are provided to facilitate understanding of the present invention and the present invention is not restricted thereto. It will be apparent to those skilled in the art that various modification and/or alternations of such description may be possible.

Therefore, the scope of the present invention should not be restricted to the foregoing examples, and modifications and variations can be made without departing from the spirit and scope of the invention as defined by the appended claims and their equivalents.

What is claimed is:

1. A method for producing Ag nanowire, comprising:
   (a) preparing a first solution that contains an Ag salt and a first reduction solvent, and a second solution that contains a water-soluble polymer, a surfactant, a viscosity enhancer and a second reduction solvent;
   (b) heating the second solution; and
   (c) introducing the first solution to the second solution, to produce Ag nanowires, wherein among the second solution in operation (a), a content of the water-soluble polymer ranges from 1 to 15 wt. % and a content of the surfactant ranges from 0.005 to 1 wt. %,
   in operation (c), the first and the second solutions are mixed, so that a ratio by weight of the Ag salt of the first solution:the surfactant of the second solution ranges from 100:0.01 to 100:15,
   a content of the viscosity enhancer in the second solution is an amount such that a viscosity of a mixture containing the viscosity enhancer, the first reduction solvent and the second reduction solvent is 1.1 to 10 times a viscosity of a mixture of the first reduction solvent and the second reduction solvent at 25° C., and
   operation (c) is carried out under a non-agitated state in which no artificial agitation is performed, and a variation in flow rate or turbulence is not caused by an external device.

2. The method of claim 1, wherein the surfactant is at least one selected from the group consisting of an anionic surfactant, a cationic surfactant and an amphoteric surfactant.

3. The method of claim 2, wherein the anionic surfactant is at least one selected from the group consisting of sodium laureth sulfate, sodium (C14-C16) olefin sulfonate and sodium dodecyl benzene sulfonate.

4. The method of claim 1, wherein the water-soluble polymer is at least one selected from the group consisting of polyvinylpyrrolidone, polyvinylalcohol, polyacrylamide, polyacrylic acid and copolymers thereof.

5. The method of claim 4, wherein a molecular weight (Mw) of the water-soluble polymer ranges from 50,000 to 1,500,000.

6. The method of claim 1, wherein the temperature of the second solution after step (b) and before step (c) satisfies the following Relation 2:

$$0.6T_b < T_h < 0.9T_b \quad \text{(Relation 2)}$$

wherein $T_h$ is a heating temperature ° C. of the second solution, and $T_b$ is a boiling point ° C. of the second reduction solvent at atmospheric pressure.

7. The method of claim 6, wherein, when the first solution is introduced in step (c), a variation in the temperature of the second solution satisfies the following Relation 3:

$$0 \leq \Delta T_2 \leq 0.1 \times T_2 \quad \text{(Relation 3)}$$

wherein $T_2$ is the temperature ° C. of the second solution after the heating step in (b), and $\Delta T_2$ is a variation in the temperature of the second solution while introducing the first solution to the second solution.

8. The method of claim 1, wherein a content of the Ag salt of the first solution in step (a) ranges from 15 to 40 wt. %.

9. The method of claim 1, wherein the Ag salt is at least one selected from the group consisting of silver nitrate, silver acetate, silver perchlorate and silver chloride.

10. The method of claim 1, wherein the first reduction solvent and the second reduction solvent are polar solvents containing at least one oxygen atom.

11. The method of claim 1, wherein the first reduction solvent and the second reduction solvent are each independently at least one selected from the group consisting of ethylene glycol, 1,2-propyleneglycol, 1,3-propyleneglycol, diethyleneglycol (DEG)(2-hydroxyethyl ether), glycerol and glucose.

12. The method of claim 1, wherein the viscosity enhancer is polyethylene glycol.

* * * * *